(12) United States Patent
Shroff et al.

(10) Patent No.: US 8,318,576 B2
(45) Date of Patent: Nov. 27, 2012

(54) DECOUPLING CAPACITORS RECESSED IN SHALLOW TRENCH ISOLATION

(75) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/092,046

(22) Filed: Apr. 21, 2011

(65) Prior Publication Data

US 2012/0267759 A1  Oct. 25, 2012

(51) Int. Cl.
*H01L 21/20* (2006.01)

(52) U.S. Cl. .......... 438/386; 438/243; 257/E21.396

(58) Field of Classification Search ............ 438/248, 438/388, 391
See application file for complete search history.

(56) References Cited

U.S. PATENT DOCUMENTS

2005/0285175 A1* 12/2005 Cheng et al. .......... 257/302
2006/0060909 A1* 3/2006 Chi et al. .......... 257/310

* cited by examiner

*Primary Examiner* — Cheung Lee
(74) *Attorney, Agent, or Firm* — Hamilton & Terrile, LLP; Michael Rocco Cannatti

(57) ABSTRACT

A semiconductor process and apparatus provide a shallow trench isolation capacitor structure that is integrated in an integrated circuit and includes a bottom capacitor plate that is formed in a substrate layer below a trench opening, a capacitor dielectric layer and a recessed top capacitor plate that is covered by an STI region and isolated from cross talk by a sidewall dielectric layer.

18 Claims, 5 Drawing Sheets

DECOUPLING CAPACITORS RECESSED IN SHALLOW TRENCH ISOLATION

BACKGROUND OF THE INVENTION

1. Field of the Invention

The present invention is directed in general to the field of semiconductor devices. In one aspect, the present invention relates to high-performance integrated circuit capacitor structures.

2. Description of the Related Art

When integrated circuits are formed on a semiconductor substrate or chip, individual integrated circuit components or circuits can be subjected to current and voltage noise caused by other circuit elements on the chip or by external power supplies. To protect an electrical network or circuit area against noise from another circuit area or an external power supply, decoupling capacitors are formed on the chip to shunt the noise through the capacitor, thereby reducing the effect of the noise on the protected area. However, leading edge fabrication processes are not able to form planar decoupling capacitors with adequate decoupling capacitance to meet the noise protection requirements without consuming large amounts of valuable circuit area.

Accordingly, a need exists for an integrated circuit manufacturing process for fabricating decoupling capacitor structures which overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
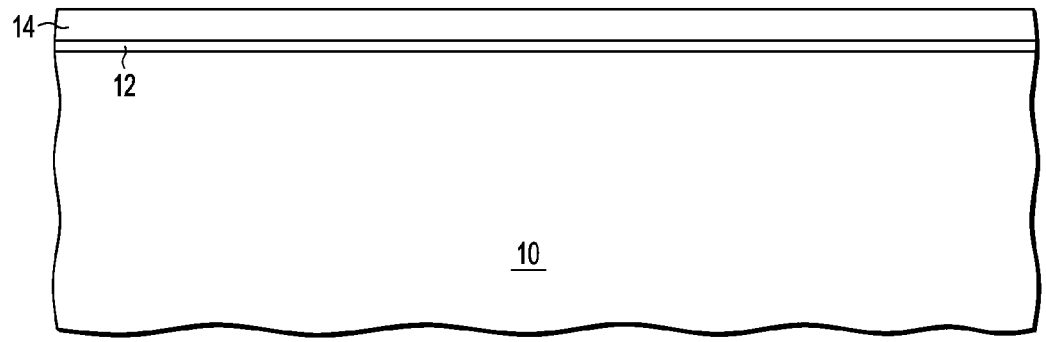
FIG. 1 illustrates a partial cross-sectional view of a semiconductor wafer structure in which mask layers are formed over a semiconductor substrate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating one or more decoupling capacitor structures in the shallow trench isolation trench or region. In selected embodiments, the decoupling trench capacitors are fabricated in existing shallow isolation trenches over a substrate such that the bottom plate is formed from the substrate, the top plate is formed with a conductive layer (e.g., metal or silicided poly) that is recessed in the trench below the channel region of the subsequently-formed active devices to reduce vertical series resistance and electrical cross-talk, and a shallow trench isolation layer of appropriate dielectric material is formed to cover the top plate. Prior to forming the top plate, a dielectric layer is fabricated in the trench that is relatively thicker on the trench sidewalls and relatively thinner on the trench bottom. The resulting dielectric layer reduces or minimizes sidewall capacitance and limits capacitance action to bottom surface, thereby isolating the decoupling trench capacitor from adjacent active device operation.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art how to make or use the present invention.

Turning now to FIG. 1, a partial cross-sectional view is illustrated of a semiconductor wafer structure in which one or more mask layers 12, 14 are formed over a semiconductor substrate layer 10. Specifically, the semiconductor wafer structure includes a semiconductor substrate layer 10 formed of a semiconductor material which may have a predetermined crystallographic orientation. Depending on the type of transistor device being fabricated, the semiconductor substrate layer 10 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor substrate layer 10 may be appropriately doped to provide n-type (electron) and p-type (hole) carriers.

The mask layer(s) shown in FIG. 1 may be formed by depositing or growing a first dielectric layer 12 (e.g., pad oxide) on the semiconductor substrate layer 10. Subsequently, an additional masking layer 14 is deposited over the first dielectric layer 12 using an appropriate masking layer material. For example, a layer of silicon nitride may be deposited to a predetermined thickness (e.g., 700-900 Angstroms). On top of the nitride layer, an additional hardmask layer (not shown) may be formed.

Figure 2:
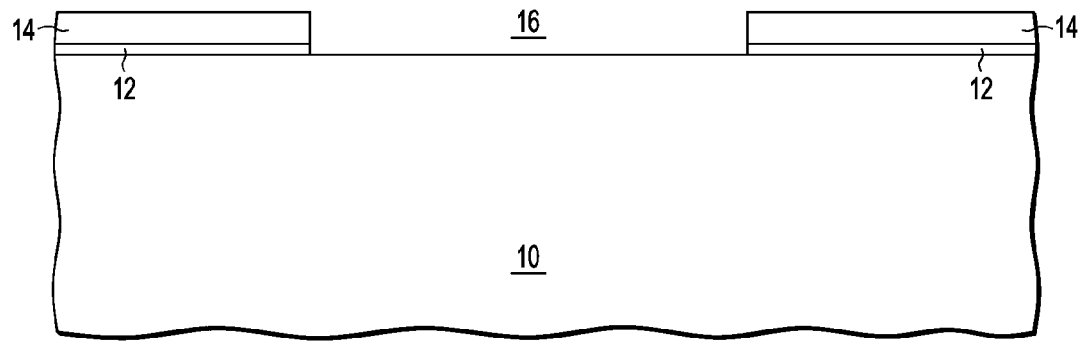
FIG. 2 illustrates processing subsequent to FIG. 1 after the mask layers are patterned to define a first opening.

FIG. 2 illustrates processing of the semiconductor wafer structure subsequent to FIG. 1 after the mask layers 12, 14 are patterned to define a first opening 16 over the semiconductor substrate layer 10. Any desired pattern and etch techniques may be used to form the mask opening(s) 16, including forming a patterned layer of photoresist (not shown) to define and etch the hardmask layers 12, 14 to serve as a mask for a hardmask etch process which etches down to the semiconductor substrate layer 10 by removing exposed portions of the hardmask layers 12, 14. After the hardmask etch process, the photoresist is stripped (e.g., with an ash/piranha process).

Figure 3:
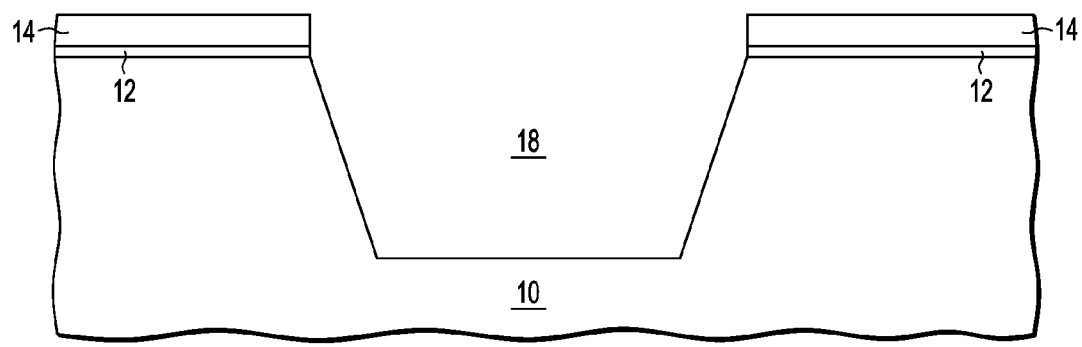
FIG. 3 illustrates processing subsequent to FIG. 2 where at least a first portion of the semiconductor substrate has been etched or removed to form a trench opening.

FIG. 3 illustrates processing of the semiconductor wafer structure subsequent to FIG. 2 where at least a first portion of the semiconductor substrate 10 has been etched or removed to form a trench opening 18. Any desired anisotropic etch technique may be used to form the trench opening(s) 18, including a dry etching process such as reactive-ion etching, ion beam etching, plasma etching or laser etching, a wet etching process wherein a chemical etchant is employed or any combination thereof. In an example embodiment, one or more trench etches are performed with the patterned mask layers 12, 14 to etch into the semiconductor substrate layer 10 to form a shallow trench opening 18. The trench opening 18 defines a region in which the substrate-terminated decoupling trench capacitor will be formed, where the exposed portion of the substrate layer 10 at the bottom of the trench opening 18 will function as a bottom capacitor plate for the decoupling capacitor structure. As will be appreciated, the bottom plate may be formed by implanting conductive impurities into the semiconductor substrate 10 at the bottom of the trench opening. Alternatively, the bottom plate may be formed before etching the trench opening by performing a relatively high energy implant of conductive impurities into the semiconductor substrate 10 at a depth of the expected trench opening.

Figure 4:
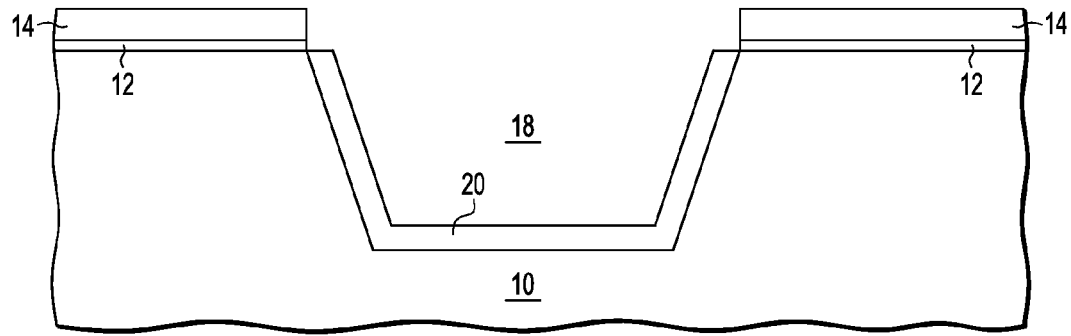
FIG. 4 illustrates processing subsequent to FIG. 3 after a dielectric layer is formed on the sidewalls and bottom of the trench opening.

FIG. 4 illustrates processing of the semiconductor wafer structure subsequent to FIG. 3 after a dielectric layer 20 is formed on the sidewalls and bottom of the trench opening. In selected embodiments, the dielectric layer 20 is formed by a thermal oxidation process which grows a layer of silicon dioxide from the semiconductor substrate 10 on the exposed bottom and sidewall surfaces of the semiconductor substrate 10, though a deposition process may also be used to form the dielectric layer 20. When formed using an existing STI liner process, the dielectric layer 20 may be formed by growing a layer of oxide to a predetermined thickness (e.g., approximately 200 Angstroms), though other materials or thicknesses may be used.

Figure 5:
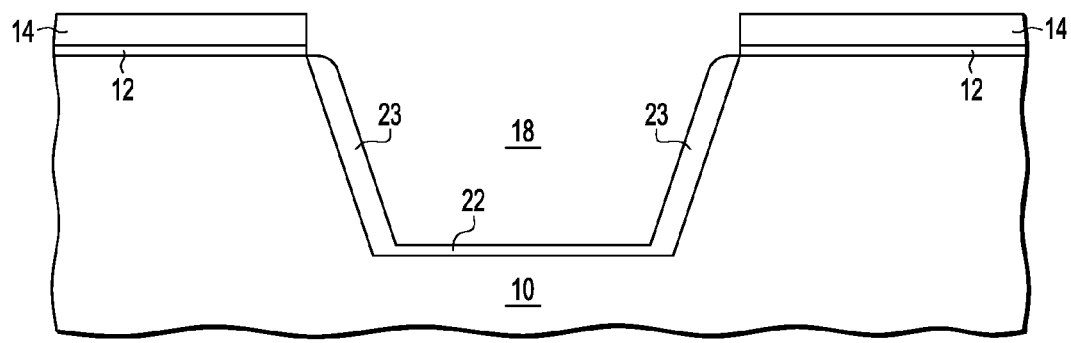
FIG. 5 illustrates processing subsequent to FIG. 4 after an anisotropic etch process thins the dielectric layer at the bottom of the trench opening while substantially retaining the thickness of the dielectric layer on the sides of the trench opening.

FIG. 5 illustrates processing of the semiconductor wafer structure subsequent to FIG. 4 after an anisotropic etch process thins the dielectric layer 22 at the bottom of the trench opening 18 while substantially retaining the thickness of the dielectric layer 23 on the sides of the trench opening 18. Any desired anisotropic etch technique may be used to thin or partially etch the dielectric layer 20 at the bottom of the trench opening, including a dry etching process such as reactive-ion etching, ion beam etching, plasma etching or laser etching, or any combination thereof. As finally formed, the thickness of the thinned dielectric layer 22 at the bottom of the trench is controlled to a predetermined thickness (e.g., approximately 30-40 Angstroms) to provide the required decoupling capacitance at the bottom of the trench while the thickness of the sidewall dielectric layer 23 is sufficient to electrically isolate the decoupling trench capacitor from adjacent active device operation.

Though not shown, it will be appreciated that the dielectric layers 22, 23 in the trench opening 18 may be formed with other processing steps. For example, the anisotropic etch process may be applied to the liner oxide layer 22 to remove all the oxide from the bottom of the trench opening while retaining sidewall oxide 23, followed by formation of a low-stress nitride layer having a predetermined thickness (e.g., approximately 20-50 Angstroms) at the bottom of the trench opening to serve as the decoupling capacitor dielectric. Alternatively, the trench opening 18 (shown in FIG. 3) may be filled with a dielectric layer which is subsequently planarized, and then patterned and etched with a separate mask and etch process to form a second trench opening which exposes a bottom portion of the trench opening 18 while retaining thick sidewall dielectric layers 23, followed by formation of capacitor dielectric layer 22 with an insulator material, such as a high-k dielectric material. As described hereinabove, the dielectric layer 22 is covered with a conductive material to form a conductive top plate over the dielectric layer 22 which may also be recessed and covered by filling the trench with a dielectric material and then re-planarizing the dielectric material. As will be appreciated, the capacitor dielectric layer 22 formed on the bottom of the trench opening may be formed with any suitable insulator or high-k dielectric material, including but not limited to silicon dioxide, oxynitride, metaloxide, low-stress nitride, and other oxides, silicates or aluminates of zirconium, hafnium, aluminum, lanthanum, strontium, tantalum, titanium and combinations thereof (e.g., $Ta_2O_5$, $ZrO_2$, $HfO_2$, $TiO_2$, $Al_2O_3$, $Y_2O_3$, $La_2O_3$, $HfSiO_X$, $ZrSiO_X$, $ZrHfO_X$, $LaSiO_X$, $YSiO_X$, $ScSiO_X$, $CeSiO_X$, $HfLaSiO_X$, $HfAlO_X$, $ZrAlO_X$, and $LaAlO_X$). In addition, multi-metallic oxides (for example barium strontium titanate, BST) may also provide high-k dielectric properties.

Figure 6:
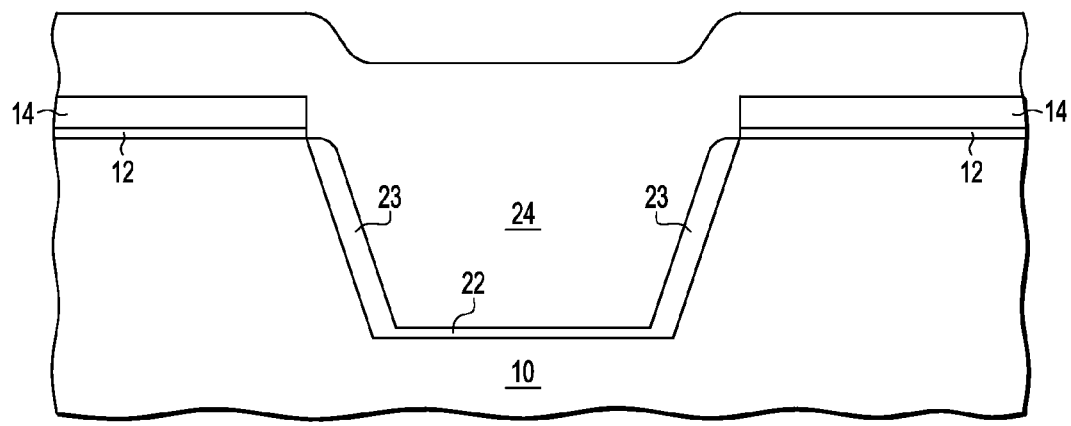
FIG. 6 illustrates processing subsequent to FIG. 5 after a conductive layer is formed over the semiconductor wafer structure to fill the trench opening.

FIG. 6 illustrates processing of the semiconductor wafer structure subsequent to FIG. 5 after a conductive layer 24 is formed over the semiconductor wafer structure to cover the dielectric layers 22, 23 and fill the trench opening. At a minimum, the conductive layer 24 is formed to a thickness that is sufficient to cover at least the bottom of the trench opening, if not entirely fill the trench opening. In selected embodiments, the conductive layer 24 is formed with one or more metal or metal-based layers 24 that are sequentially deposited or formed over the dielectric layers 22, 23 using any desired deposition or sputtering process, such as chemical vapor deposition (CVD), plasma-enhanced chemical vapor deposition (PECVD), physical vapor deposition (PVD), atomic layer deposition (ALD), molecular beam deposition (MBD) or any combination(s) thereof. The first metal-based layer 24 may be formed with a refractory metal selected from the group consisting of Ti, V, Cr, Zr, Nb, Mo, Ru, Rh, Hf, Ta, W, Re, Os, or Ir. Alternatively, the conductive layer 24 may be formed with a layer of conductive polysilicon using CVD, PECVD, PVD, ALD, or any combination(s) thereof. As deposited, the polysilicon layer 24 may be formed as an undoped or lightly doped layer having relatively low conductivity or current flow, in which case the conductivity in the polysilicon layer 24 is established with one or more subsequent doping or implantation steps. However, it will be appreciated, that the polysilicon layer 24 may be formed as a heavily doped layer having relatively high conductivity. In addition, the polysilicon layer 24 can be initially deposited in an amorphous or polycrystalline state, but it will be in a polycrystalline state after subsequent annealing steps in the device integration. The material(s) for the polysilicon layer 24 can be silicon, silicon-germanium, or other suitable semiconductors.

Figure 7:
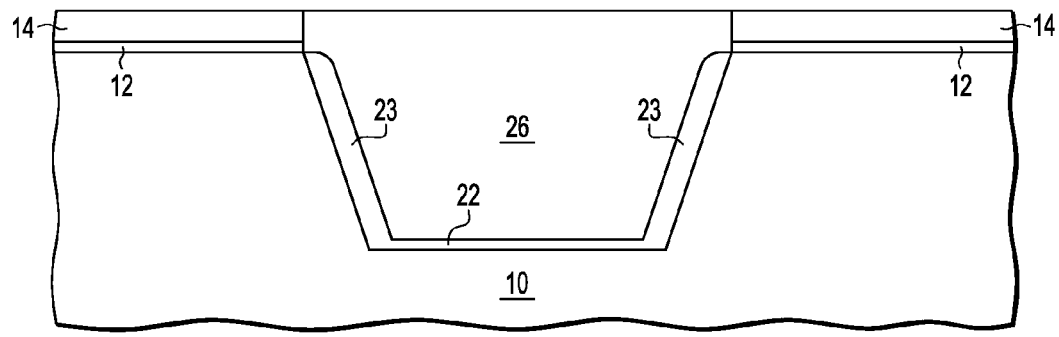
FIG. 7 illustrates processing subsequent to FIG. 6 after the conductive layer has been planarized, such as by applying a chemical mechanical polish (CMP) to the semiconductor wafer structure.

FIG. 7 illustrates processing of the semiconductor wafer structure subsequent to FIG. 6 after the conductive layer 26 has been planarized. As depicted, the semiconductor wafer structure is polished and/or etched back until substantially coplanar with the mask layer(s) 12, 14, such as by applying a CMP step, alone or in combination with additional etching, stripping and/or cleaning processes. In addition or in the alternative, the conductive layer 26 may be subjected to an overetch process to form a recessed top capacitor plate 28 such as shown and described below with reference to FIG. 8. In an alternative embodiment, the conductive layer 24 may be selectively removed from portions of the die area by patterning a mask followed by subsequent etching.

Figure 8:
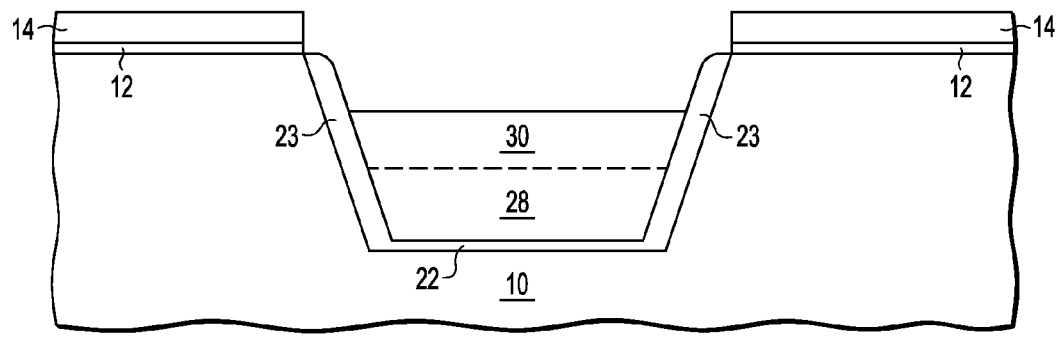
FIG. 8 illustrates processing subsequent to FIG. 7 after a recess etch and optional silicidation is performed on the conductive layer in the trench opening.

FIG. 8 illustrates processing of the semiconductor wafer structure subsequent to FIG. 7 after a recess etch is performed on the conductive layer 26 in the trench opening to form the recessed top capacitor plate 28. As will be appreciated, the recess etch process will depend on the material used to form the conductive layer. For example, a controlled metal etch process (e.g., a fluorine-based RIE etch chemistry) may be applied to recess one or more metal or metal-based layers formed in the trench opening to define a top capacitor plate 28 for the decoupling capacitor structure which is recessed well below the active device area in the semiconductor wafer structure.

In embodiments where the conductive layer 26 is formed with polysilicon, a controlled semiconductor etch process (e.g., a chlorine-based RIE etch chemistry) may be applied to recess the polysilicon layer formed in the trench opening to define the recessed top capacitor plate 28 for the decoupling capacitor structure. The resulting recessed top plate 28 for the decoupling capacitor may be silicided to reduce resistance using any desired silicide formation process to form a silicide layer 30 (such as $CoSi_2$ or NiSi) on at least the top of the recessed top plate 28. An example sequence of silicide formation steps would be to deposit or sputter a conductive or metal layer (e.g., cobalt or nickel) over the semiconductor wafer structure, followed by a heating step to react the metal layer with the recessed polysilicon layer 28 to form a silicided layer 30. In an illustrative embodiment, the reaction of the metal layer and the polysilicon layer 28 is promoted by performing an initial rapid thermal anneal step (e.g., 400-600° C.), followed by a Piranha clean step to remove excess metal, and then followed by a second rapid thermal anneal step (e.g., 650-850° C.). The timing and temperature of the initial rapid thermal anneal step are selected so that the metal layer reacts with the exposed surfaces of the polysilicon layer 28. After the Piranha clean step, the timing and temperature of the second rapid thermal anneal step are selected so that the reacted silicide 30 is pushed into a low resistivity phase. Though only part of the recessed top capacitor plate 28 is shown as being silicided, it will be appreciated that the entirety of the recessed top capacitor plate 28 may be converted to silicide.

Figure 9:
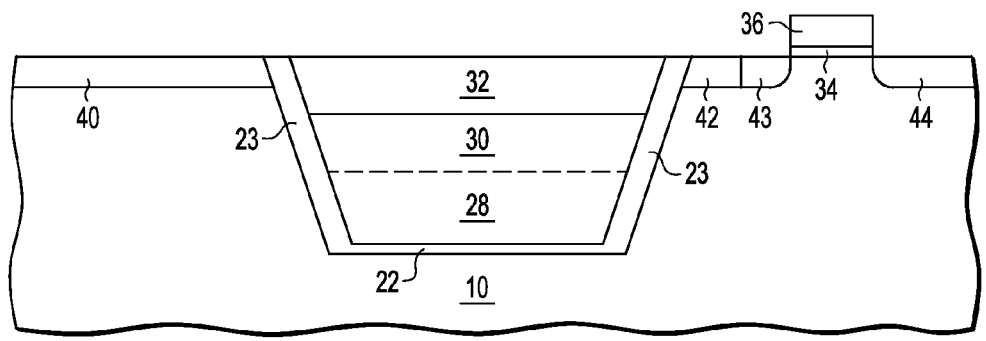
FIG. 9 illustrates processing subsequent to FIG. 8 after a planarized shallow trench isolation fill layer is formed in the trench opening and well tie structures are formed in the semiconductor substrate.

FIG. 9 illustrates processing of the semiconductor wafer structure subsequent to FIG. 8 after a planarized shallow trench isolation region 32 is formed in the trench opening and well tie structures are formed in the semiconductor substrate 10. With the hardmask layer(s) 12, 14 in place, a shallow trench isolation region 32 is formed by filling the trench opening to cover the recessed top capacitor plate 28 with a polished insulator material, such as by filling the trench opening with a deposited dielectric (such as high density plasma oxide), and then polishing, etching or otherwise planarizing the deposited dielectric to form the shallow trench isolation region 32, alone or in combination with additional etching, stripping and/or cleaning processes. Subsequently, one or more etch processes are used to remove the remaining hardmask layer(s) 12, 14. As will be appreciated, the top portions of the semiconductor substrate 10 and the sidewall dielectric layer 23 may be removed by the polish and/or etch process(es).

Following the formation of the gate electrodes by patterning gate dielectric layer 34 and gate electrode layer 36, electrical contact is made with the top and bottom plates of the decoupling capacitor in order to connect the capacitor to the integrated circuit. For example, the bottom plate may be connected by forming well tie regions 40, 42 in the semiconductor substrate 10 during fabrication of the active MOSFET devices. As shown, a non-abutted well tie 40 may be formed with materials having a predetermined conductivity type (e.g., n-type or p-type) impurities, such as by using an implant mask to selectively diffuse or implant the impurities into the semiconductor substrate 10 to a predetermined implant energy and dopant concentration (e.g., at least approximately 1E19 atoms/cm$^3$) so as to be located in an upper portion of the semiconductor substrate 10.

In similar fashion, an abutted well tie 42 for connecting the bottom plate may be formed adjacent to the source/drain region 43 by using an implant mask to selectively diffuse or implant the impurities into the semiconductor substrate 10 to a predetermined implant energy and dopant concentration. As will be appreciated, the abutted well tie 42 is formed separately from the source/drain regions 43, 44 using materials of opposite polarity to result in different doping. To align the abutted well tie region 42 with the source/drain region 43, the abutted well tie region 42 may be formed first by masking off the active device area, and then implanting the well tie region 42 with the appropriate doping species. Typically after gate formation, the well tie doping for each type of well can also be accomplished by implanting the well-tie region during the source/drain formation of the device of the opposite polarity (e.g., the NMOS source/drain implant can be used to form the well tie region for the PMOS device and vice-versa). Though not explicitly shown, it will be appreciated that gate electrode 34, 36 and source/drain regions 42, 44 formed on either side of the STI region 32 are electrically isolated from one another by the planarized shallow trench isolation region 32.

As formed, the doping concentration of the well tie regions 40, 42 is controlled to allow ohmic contacts to be subsequently formed to the well ties 40, 42 and source/drain regions 43, 44 using one or more masking sequences in conjunction with the doping operation(s) to achieve the desired doping concentration. In addition, the placement, doping type, and doping concentration of the well tie region(s) 40, 42 is selected to make electrical contact with the bottom plate of the decoupling capacitor formed in the semiconductor substrate 10 (which may be formed as an n-well or p-well region).

Though not explicitly shown, it will be appreciated that the top plate may be electrically connected to the integrated circuit by etching a top plate contact opening through the STI region 32 using a controlled pattern and anisotropic etch process to expose the top plate, and then filling the top plate contact opening with one or more conductive materials to form a top plate contact (not shown). To control the contact opening etch process, it will be appreciated that an etch stop layer (e.g., silicon nitride) may be formed over the recessed top capacitor plate 28 prior to formation of the STI region 32.

It will be appreciated that other capacitor plate structures may be formed in the STI trench to provide enhanced decoupling capacitance to meet the noise protection requirements. For example, reference is now made to FIG. 10 which illustrates processing of the semiconductor wafer structure subsequent to FIG. 6 after the conductive layer 24 (shown in FIG. 6) has been anisotropically etched to form sidewall capacitor plate structures 52 in the trench opening 50. As depicted, a high aspect ratio anisotropic etch process may be applied to the conductive layer 24 to expose a portion of the thinned dielectric layer 22 at the bottom of the trench while leaving conductive top plate structures 52 on the sidewalls of the opening 50. Depending on the constituent materials and dimensions of the deposited conductive layer 24, the etching may use one or more anisotropic etch processes to form conductive top plate structures 52, including a dry etching process (such as reactive-ion etching, ion beam etching, plasma etching, laser etching), or any combination thereof. Preferably, the fabrication sequence and/or etch process used to form the trench opening 50 is controlled to prevent removal of the thinned dielectric layer 22 from the bottom of the trench, such as by including an etch stop layer (e.g., silicon nitride) in the thinned dielectric layer 22. In addition, the etch process may also be selected and controlled so that the top of the conductive top plate structures 52 are recessed well below the active device area in the semiconductor wafer structure, or at least have a minimal upper dimension as compared to a wider bottom dimension adjacent to the thinned dielectric layer 22. If the conductive top plate structures 52 are formed with a polycrystalline semiconductor material, a silicide process may advantageously be applied to reduce the series resistance of the decoupling capacitor plate.

Figure 10:
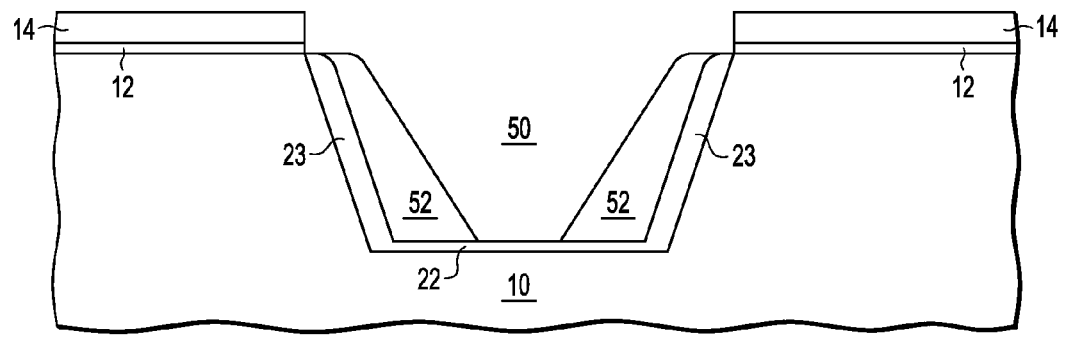
FIG. 10 illustrates processing subsequent to FIG. 6 after the conductive layer has been anisotropically etched to form sidewall capacitor plate structures in the trench opening.
Figure 11:
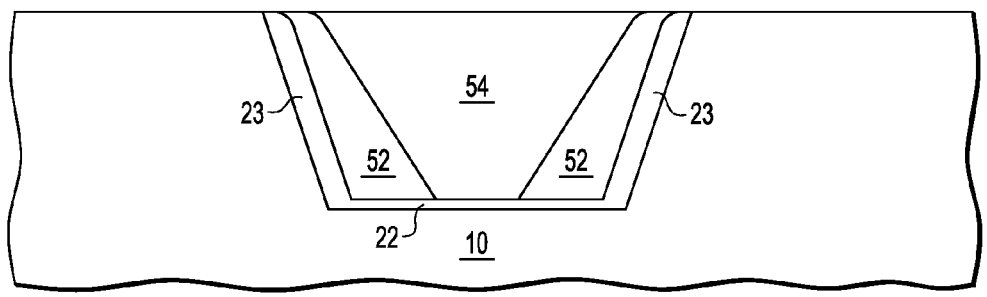
FIG. 11 illustrates processing subsequent to FIG. 10 after a planarized shallow trench isolation fill layer is formed in the trench opening.

FIG. 11 illustrates processing of the semiconductor wafer structure subsequent to FIG. 10 after a planarized shallow trench isolation region 54 is formed in the trench opening. In an example sequence, a shallow trench isolation region 54 is formed by filling the trench opening 50 to cover the recessed top plate structures 52 with a polished insulator material, such as by filling the trench opening with a deposited dielectric (such as high density plasma oxide), and then polishing, etching or otherwise planarizing the deposited dielectric to form the shallow trench isolation region 54, alone or in combination with additional etching, stripping and/or cleaning processes. In addition, one or more etch processes are used to remove the remaining hardmask layer(s) 12, 14.

Figure 12:
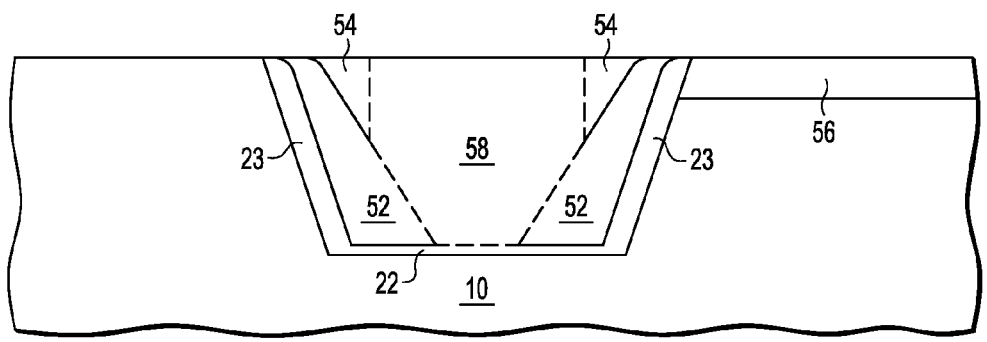
FIG. 12 illustrates processing subsequent to FIG. 11 after a bar contact structure layer is formed to connect the sidewall capacitor plate structures into a top capacitor plate.

FIG. 12 illustrates processing of the semiconductor wafer structure subsequent to FIG. 11 after the top and bottom plates of the decoupling capacitor are electrically connected to the remainder of the integrated circuit. For example, the bottom plate formed in the semiconductor substrate 10 below the trench may be connected by forming well tie regions 56 in the semiconductor substrate 10, such as by implanting materials having a predetermined conductivity type (e.g., n-type or p-type) impurities using an implant mask to selectively diffuse or implant the impurities into the semiconductor substrate 10 to a predetermined implant energy and dopant concentration (e.g., at least approximately $1E19$ atoms/$cm^3$) so as to be located in an upper portion of the semiconductor substrate 10. In addition, the top plate may be electrically connected by forming a bar contact structure layer in the STI region 54 which electrically connects the conductive top plate structures 52. To this end, a bar contact opening 58 may be etched through the STI region 54 using a controlled pattern and anisotropic etch process to expose the conductive top plate structures 52. By filling the bar contact opening 58 with one or more conductive materials, the top plate contact 58 is formed.

Selected embodiments of the present invention may also be implemented with SOI semiconductor substrate to form a decoupling capacitor structure in a deep trench isolation region such that the bottom plate is formed from the underlying semiconductor substrate and the top plate is formed with a conductive layer (e.g., metal or silicided poly) that is recessed in the deep trench isolation region below the top of the SOI layer and the channel region. In addition, the deep trench decoupling capacitor may be integrated with existing fabrication processes with minimal additional process steps.

Figure 13:
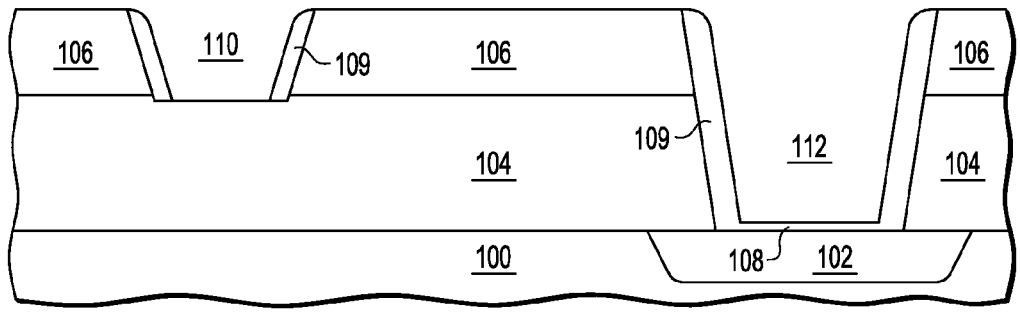
FIG. 13 is a partial cross-sectional view of a semiconductor wafer structure having semiconductor-on-insulator (SOI) layers formed over a semiconductor substrate after shallow and deep trench openings are formed with a relatively thin dielectric layer at the bottom of the trench openings and a relatively thick dielectric layer on the sides of the trench openings.

To provide an example fabrication sequence for selected SOI embodiments, reference is now made to FIG. 13 which depicts a partial cross-sectional view of a semiconductor wafer structure having semiconductor-on-insulator (SOI) layers 104, 106 formed over a semiconductor substrate 100 in which shallow and deep trench openings 110 and 112, respectively, are formed with a relatively thin dielectric layer 108 at the bottom of the deep trench openings and a relatively thick dielectric layer 109 on the sides of the trench openings. Specifically, the semiconductor wafer structure includes a first semiconductor layer 100 formed of a semiconductor material which may have a first crystallographic orientation. Depending on the type of transistor device being fabricated, the first semiconductor layer 100 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor layer 100 may be appropriately doped to provide n-type (electron) and p-type (hole) carriers. In the first semiconductor layer, a bottom plate 102 may be formed in the intended deep trench location by implanting impurities having a predetermined conductivity type (e.g., n-type or p-type) using an implant mask to selectively diffuse or implant the impurities into the semiconductor substrate 100 to a predetermined implant energy and dopant concentration.

The SOI layers include an insulator layer 104 formed on the first semiconductor layer 100 which will ultimately be used to form the buried oxide (BOX) layer for semiconductor-on-insulator devices. In addition, the SOI layers include a second semiconductor layer 106 formed of a semiconductor material which may have a crystallographic orientation which is different from the first crystallographic orientation, though as will be appreciated, it is not necessary that the second semiconductor layer 106 have a different crystallographic orientation. Depending on the type of transistor device being fabricated, the second semiconductor layer 106 may be formed from any semiconductor material, including, for example, Si, SiC, SiGe, SiGeC, Ge, GaAs, InAs, InP as well as other Group IV, III/V or II/VI compound semiconductors or any combination thereof. It will also be appreciated that the second semiconductor layer 106 may be appropriately doped to provide n-type (electron) and p-type (hole) carriers.

In the depicted semiconductor wafer structure, a shallow trench opening 110 has been formed in the second semiconductor layer 106 using an STI etch process (e.g., applying anisotropic etching to patterned trench etch mask layers (not shown) to selectively form a first trench opening 110 in the SOI layer 106. With a separate trench etch mask and etch process, a deep trench opening 112 is also formed in the SOI layers 106, 104 to expose the underlying semiconductor substrate 100, such as by using a deep etch process (e.g., applying one or more anisotropic etch processes to a patterned mask layer). Once the shallow and deep trench openings 110 and 112, respectively, are formed, a dielectric layer is formed in the openings 110, 112 such that a relatively thin dielectric layer 108 is formed at the bottom of the deep trench opening 112 and a relatively thick dielectric layer 109 is formed on the sides of the trench openings 110, 112. For example, a dielectric layer may be formed by depositing or thermally growing a layer of silicon dioxide on the exposed bottom and sidewall surfaces of the openings 110, 112, which is then anisotropically etched to thin the dielectric layer on the bottom surface to a predetermined thickness (e.g., approximately 30-40 Angstroms), though other materials or thicknesses may be used.

Figure 14:
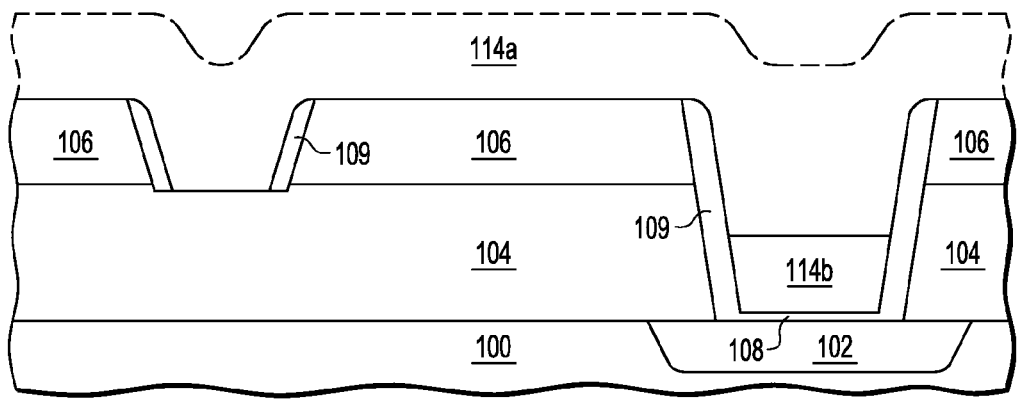
FIG. 14 illustrates processing subsequent to FIG. 13 after a conductive layer is formed over the semiconductor wafer structure to fill the trench openings and then etched or recessed to form the top plate.

FIG. 14 illustrates processing of the semiconductor wafer structure subsequent to FIG. 13 after a conductive layer 114a (indicated with dashed lines) is formed over the semiconductor wafer structure to fill the trench openings 110, 112 and then etched or recessed to form the top plate 114b. The conductive layer 114a may be formed from a metal or metal-based layers, such as by depositing a refractory metal over the trench etch mask layers (not shown) and the dielectric layers 108, 109 using any desired deposition or sputtering process, such CVD, PECVD, PVD, ALD, or combinations thereof. Alternatively, the conductive layer 114a may be formed from a doped or undoped polysilicon layer that is blanket deposited over the trench etch mask layers (not shown) and the dielectric layers 108, 109 by CVD, PECVD, PVD, ALD, or combinations thereof to a thickness that is sufficient to completely fill the trench openings 110, 112. In an example embodiment, the conductive layer 114a is formed by depositing a layer of highly doped polysilicon (e.g., with a boron concentration of at least $1E19/cm^3$) to a predetermined thickness (e.g., 8000 Angstroms). As deposited, the conductive layer 114a is formed to fill at least the bottom of the deep trench opening 112 where it will subsequently form the top capacitor plate for the decoupling capacitor.

After forming the conductive layer 114a over the semiconductor wafer structure, one or more CMP or etch back steps are applied to remove the conductive layer material from the shallow trench opening 110 and from the upper portion of the deep trench opening 112. However, the timing and chemistry of the etch process are controlled to leave conductive layer material in the lower portion of the deep trench opening 112, thereby forming the recessed top capacitor plate 114b which is recessed well below the second semiconductor layer 106 and/or the active device area in the semiconductor wafer structure. As explained above, the recess etch process will depend on the material used to form the conductive layer. In addition, there may be additional processing steps, such as siliciding the top capacitor plate 114b if formed with a semiconductor material to reduce vertical series resistance of the decoupling capacitor.

Figure 15:
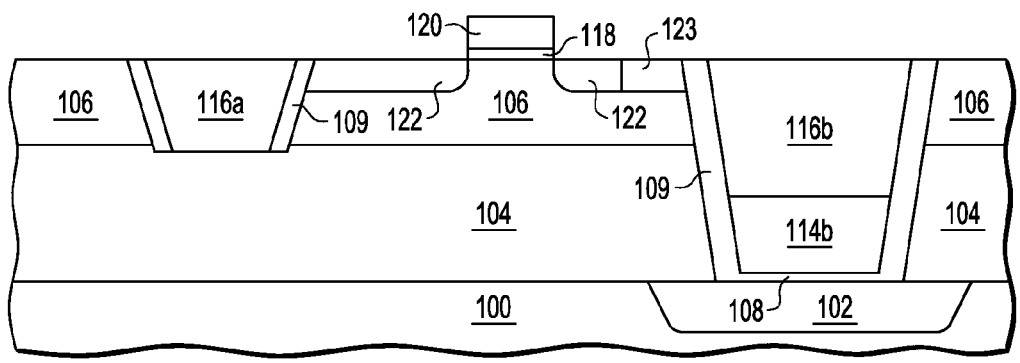
FIG. 15 illustrates processing subsequent to FIG. 14 after a planarized shallow trench isolation fill layer is formed to fill the shallow trench opening and to cover the recessed top capacitor plate formed in the deep trench opening, thereby forming a decoupling capacitor in a deep isolation trench such that the top plate is formed below the top of the SOI layer with part of the conductive layer and the bottom plate is formed in the underlying semiconductor substrate.

FIG. 15 illustrates processing of the semiconductor wafer structure subsequent to FIG. 14 after planarized shallow trench isolation fill layer 116a, 116b is formed. As will be appreciated, planarization process may remove the top portions of the semiconductor layer 106 and the sidewall dielectric layer 109. The first STI fill layer 116a fills the shallow trench opening 110 while the second STI fill layer 116b covers the recessed top capacitor plate 114b formed in the deep trench opening 112, thereby forming a decoupling capacitor in a deep isolation trench such that the top plate 114b is formed below the top of the SOI layer 104 and the bottom plate 102 is formed in the underlying semiconductor substrate 100. After forming the active device gate electrode structures 118, 120, the source/drain regions 122 may also be formed along with an abutted well tie region 123 to electrically connect the decoupling capacitor plates to the integrated circuit. In addition, a top plate contact or bar contact structure layer may be formed in the deep STI region 116b to electrically connect the recessed top capacitor plate 114b to the integrated circuit. The bottom plate 102 of the capacitor may be connected by a contact to the substrate (not shown) that is common to SOI processing.

In accordance with the example embodiments described above, a high capacitance decoupling capacitor may be formed in existing STI regions without requiring dedicated trenches. To this end, the STI trenches are lined with relatively thick sidewall dielectric layers to provide electrical isolation and reduced capacitance for minimizing any impact on MOSFET operation. In addition, by forming a recessed top plate with metal or highly conductive semiconductor material (e.g., silicide), the STI trench openings may be partially filled with isolation material to provide electrical isolation benefits with reduced vertical series resistance for the decoupling capacitor. The proposed STI decoupling capacitors can be deployed in a variety of areas using the STI regions to place decoupling capacitors outside of the active area, including placement in narrow spaces (e.g., long, skinny structures) without interfering with device operation. Another benefit of the recessed decoupling capacitor plates is that field poly features can be placed normally over the STI regions since the recessed STI decoupling capacitors will not interfere with the field poly features. Furthermore, the formation of these capacitors will not interfere with tiles or dummy features which are needed for CMP control.

It will be appreciated that additional processing steps will be used to fabricate and connect the decoupling capacitor structure described herein, such as forming a contact to the bottom capacitor plate 102 and forming a contact to the recessed top plate 114b by etching the deep STI fill region 116b. In addition, other circuit features may be formed on the wafer structure, such as transistor devices, using one or more of sacrificial oxide formation, stripping, isolation region formation, well region formation, gate dielectric and electrode formation, extension implant, halo implant, spacer formation, source/drain implant, heat drive or anneal steps, and polishing steps, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

By now it will be appreciated that there is provided herein a capacitor fabrication method and resulting capacitor structure, such as a decoupling capacitor. As disclosed, a semiconductor substrate structure having a top surface is provided as either a bulk semiconductor substrate or an SOI substrate having a first semiconductor layer and a second semiconductor layer formed over at least part of the first semiconductor layer, where the first semiconductor layer comprises the doped semiconductor region which forms the bottom capacitor plate, and where the second semiconductor layer is separated from the first semiconductor layer by an insulator layer. In the semiconductor substrate structure, a trench opening is formed by selectively removing a portion of the semiconductor substrate structure in a first region to define bottom and sidewall surfaces where the bottom surface exposes a doped semiconductor region in the semiconductor substrate structure which forms a bottom capacitor plate. In the trench opening, one or more insulator layers are formed to include a sidewall surface layer and a bottom surface layer. In selected embodiments, the insulator layer(s) formed on the sidewall have a thickness that provides electrical isolation for the capacitor. In other embodiments, the insulator layer(s) are formed by growing or depositing a dielectric layer on the bottom and sidewall surfaces in the trench opening, anisotropically etching the dielectric layer to remove the dielectric layer from the bottom of the trench opening while substantially retaining the dielectric layer on the sidewall surface of the trench opening, and then forming a second bottom layer (e.g., a low stress nitride layer or other low stress dielectric layer) on the bottom of the trench opening which forms a capacitor dielectric layer for the decoupling capacitor. Subsequently, a recessed conductive top capacitor plate layer is formed on the bottom surface layer in the trench opening having a top surface which is below the top surface of the semiconductor substrate structure. In selected embodiments, the recessed conductive layer is formed by depositing a conductive layer (e.g., a metal-based or silicided semiconductor material) on at least the bottom surface layer in the trench opening, and then reducing a thickness of the conductive layer in the trench opening (e.g., by polishing and/or etching) to form the recessed conductive top capacitor plate layer having a top surface which is below the top surface of the semiconductor substrate structure. In other embodiments, the recessed conductive top capacitor plate layer is formed by depositing a conductive layer on at least the bottom surface layer in the trench opening, and then anisotropically etching the conductive layer in the trench opening to form sidewall top capacitor plate structures in the trench opening without removing the bottom surface layer. After forming the recessed conductive layer, a shallow trench isolation region is formed in the trench opening to cover the recessed conductive top capacitor plate layer, such as by depositing an insulating material to cover the recessed conductive top capacitor plate layer and fill the trench opening, and then planarizing the insulating material to form the shallow trench isolation region in the trench opening.

In another form, there is provided herein a capacitor fabrication method and resulting capacitor structure, such as a decoupling capacitor. As disclosed, a semiconductor substrate structure having a top surface is provided. In the semiconductor substrate structure, a shallow trench opening is formed by selectively removing a portion of the semiconductor substrate structure in a first region to define bottom and sidewall surfaces where the bottom surface exposes a doped semiconductor region in the semiconductor substrate structure which forms at least part of a bottom capacitor plate. In the shallow trench opening, one or more dielectric layers are formed, including one or more dielectric layers on the sidewall and bottom surfaces of the shallow trench opening. In selected embodiments, the dielectric layer(s) are formed by depositing or growing a dielectric layer on the bottom and sidewall surfaces in the shallow trench opening, and then anisotropically etching the dielectric layer in the shallow trench opening to partially etch the dielectric layer to form an isolation dielectric layer on the sidewall surface of the shallow trench opening that is at least twice as thick as a capacitor dielectric layer on the bottom surface of the shallow trench opening. In other embodiments, the dielectric layer(s) are formed by growing or depositing a dielectric layer on the bottom and sidewall surfaces in the shallow trench opening, anisotropically etching the dielectric layer to remove the dielectric layer from at least part of the bottom of the shallow trench opening while substantially retaining the dielectric layer on the sidewall surface of the shallow trench opening, and then forming a second bottom liner layer (e.g., a low stress nitride layer) on the bottom of the shallow trench opening which forms a capacitor dielectric layer for the decoupling capacitor. On the bottom surface dielectric layer(s), a recessed conductive layer is formed in the shallow trench opening with a metal-based material or silicided semiconductor material as a top capacitor plate which may have a top surface which is recessed below the top surface of the semiconductor substrate structure. The conductive layer may be formed by depositing a conductive layer on at least the one or more dielectric layers on the bottom surface of the shallow trench opening, and then polishing and/or etching the conductive layer in the shallow trench opening to form the top capacitor plate having a top surface that is recessed from the top surface of the semiconductor substrate structure. Alternatively, the conductive layer may be formed by depositing a conductive layer on at least the one or more dielectric layers on the bottom surface of the shallow trench opening, and then anisotropically etching the conductive layer in the shallow trench opening to form sidewall top capacitor plate structures in the trench opening without removing the bottom surface liner layer. Subsequently, a shallow trench isolation layer is formed over the top capacitor plate.

In yet another form, there is provided herein an integrated circuit trench capacitor structure and method for fabricating same. As disclosed, the capacitor structure includes a first capacitor plate formed from a doped semiconductor layer to be located below a shallow trench formed in a substrate having a top surface. The capacitor structure also includes a capacitor dielectric layer formed on the first capacitor plate and in the shallow trench. In addition, the capacitor structure includes a second capacitor plate formed on the capacitor dielectric layer from a conductive material that is formed in the trench, where the second capacitor plate is electrically isolated from adjacent semiconductor material and active device operation by a sidewall dielectric layer formed on sidewalls of the trench opening at a thickness that provides electrical isolation. As formed, the trench in which the second capacitor plate is formed is located to separate a first active area in which is formed one or more first transistors of a first conductivity type from a second active area in which is formed one or more second transistors of a second different conductivity type.

In still yet another form, there is provided an integrated circuit trench capacitor structure and method for fabricating same. As disclosed, the capacitor structure includes a first capacitor plate formed from a doped semiconductor layer to be located below a trench formed in a substrate structure having a top surface. The capacitor structure also includes a capacitor dielectric layer formed on the first capacitor plate and in the trench. In addition, the capacitor structure includes a recessed second capacitor plate formed on the capacitor dielectric layer from a conductive material that is formed in the trench, where the recessed second capacitor plate has a top surface which is below the top surface of the substrate structure and covered with a shallow trench isolation region to provide electrical isolation from adjacent semiconductor material and active device operation. Finally, the capacitor structure includes a shallow trench isolation region formed over the recessed second capacitor plate. As formed, the trench in which the second capacitor plate is formed is located to separate a first active area in which is formed one or more first transistors of a first conductivity type from a second active area in which is formed one or more second transistors of a second different conductivity type.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, different dopant types and concentrations may be used than disclosed herein. Moreover, the dimensions of the described layers may deviate from the disclosed dimension values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a capacitor, comprising:
providing a semiconductor substrate structure having a top surface;
forming a trench opening in the semiconductor substrate structure by selectively removing a portion of the semiconductor substrate structure in a first region to define bottom and sidewall surfaces where the bottom surface exposes a semiconductor region in the semiconductor substrate structure which forms a bottom capacitor plate;
forming a first dielectric layer on the bottom and sidewall surfaces in the trench opening;
anisotropically etching the first dielectric layer in the trench opening to remove the first dielectric layer from the bottom of the trench opening while retaining a sidewall surface layer on the sidewall surface of the trench opening;
forming a capacitor dielectric layer on the bottom of the trench opening;
forming a recessed conductive top capacitor plate layer on the capacitor dielectric layer in the trench opening, the recessed conductive top capacitor plate layer having a top surface which is below the top surface of the semiconductor substrate structure; and
forming a dielectric layer in the trench opening to cover the recessed conductive top capacitor plate layer, the dielectric layer having a bottom surface which is below the top surface of the semiconductor substrate structure.

2. The method of claim 1, where providing the semiconductor substrate structure comprises providing a semiconductor-on-insulator semiconductor substrate structure comprising a first semiconductor layer and a second semiconductor layer located over at least part of the first semiconductor layer, where the first semiconductor layer comprises the semiconductor region which forms the bottom capacitor plate, and where the second semiconductor layer is separated from the first semiconductor layer by an insulator layer.

3. The method of claim 2, where forming the trench opening comprises selectively etching a trench opening in the second semiconductor layer and the insulator layer to expose the first semiconductor layer.

4. The method of claim 1, where the sidewall surface layer in the trench opening is at least twice as thick as the capacitor dielectric layer in the trench opening.

5. The method of claim 1, where forming the recessed conductive top capacitor plate layer comprises:
depositing a conductive layer on at least the capacitor dielectric layer in the trench opening; and
reducing a thickness of the conductive layer in the trench opening to form the recessed conductive top capacitor plate layer having a top surface which is below the top surface of the semiconductor substrate structure.

6. The method of claim 1, where forming the recessed conductive top capacitor plate layer comprises:
depositing a conductive layer on at least the capacitor dielectric layer in the trench opening; and
anisotropically etching the conductive layer in the trench opening to form sidewall top capacitor plate structures in the trench opening without removing the capacitor dielectric layer.

7. The method of claim 1, where forming the recessed conductive top capacitor plate layer comprises depositing a metal-based material on the capacitor dielectric layer in the trench opening as a top capacitor plate having a top surface which is below the top surface of the semiconductor substrate structure.

8. The method of claim 1, where forming the recessed conductive top capacitor plate layer comprises forming a silicided semiconductor material on the capacitor dielectric layer in the trench opening as a top capacitor plate having a top surface which is below the top surface of the semiconductor substrate structure.

9. The method of claim 1, where forming the dielectric layer comprises:
depositing an insulating material to cover the recessed conductive top capacitor plate layer and fill the trench opening; and
planarizing the insulating material to form an isolation region in the trench opening.

10. A method for fabricating a capacitor, comprising:
providing a semiconductor substrate structure having a top surface;
forming a shallow trench opening in the semiconductor substrate structure by selectively removing a portion of the semiconductor substrate structure in a first region to define bottom and sidewall surfaces of a trench opening where the bottom surface exposes a semiconductor region in the semiconductor substrate structure which forms at least part of a bottom capacitor plate;
forming one or more dielectric layers on bottom and sidewall surfaces of the trench opening by forming a dielectric layer on the bottom and sidewall surfaces in the trench opening, and anisotropically etching the dielectric layer in the trench opening to partially etch the dielectric layer to form an isolation dielectric layer on the sidewall surface of the trench opening that is at least twice as thick as a capacitor dielectric layer on the bottom surface of the trench opening;
forming a recessed conductive layer on the one or more dielectric layers on the bottom surface of the trench opening as a top capacitor plate, where the recessed conductive layer has a top surface which is below the top surface of the semiconductor substrate structure; and
forming a shallow trench isolation layer over the top capacitor plate, the shallow trench isolation layer having a bottom surface which is below the top surface of the semiconductor substrate structure.

11. The method of claim 10, where forming the recessed conductive layer comprises:
depositing a conductive layer on at least the one or more dielectric layers on the bottom surface of the trench opening; and
reducing the conductive layer in the trench opening to form the top capacitor plate having a top surface that is recessed from the top surface of the semiconductor substrate structure.

12. The method of claim 10, where forming the recessed conductive layer comprises:
depositing a conductive layer on at least the one or more dielectric layers on the bottom surface of the trench opening; and
anisotropically etching the conductive layer in the trench opening to form sidewall top capacitor plate structures in the trench opening without removing the one or more dielectric layers on the bottom surface of the trench opening.

13. The method of claim 10, where forming the recessed conductive layer comprises depositing a metal-based material on the one or more dielectric layers on the bottom surface of the trench opening as a top capacitor plate having a top surface which is recessed below the top surface of the semiconductor substrate structure.

14. The method of claim 10, where forming the conductive layer comprises forming a silicided semiconductor material on the one or more dielectric layers on the bottom surface of the trench opening as a top capacitor plate.

15. The method of claim 10, where forming the one or more dielectric layers comprises forming a sidewall surface layer that is at least twice as thick as a bottom surface layer in the trench opening.

16. An integrated circuit trench capacitor structure, comprising:
a first capacitor plate located in a doped semiconductor layer to be located below a trench formed in a substrate structure having a top surface;
a capacitor dielectric layer located on the first capacitor plate and in the trench; and
a recessed second capacitor plate located on the capacitor dielectric layer and made from a conductive material in the trench, where the recessed second capacitor plate has a top surface which is located below the top surface of the substrate structure and which is covered with a shallow trench isolation layer having a bottom surface which is below the top surface of the substrate structure and surrounded by an insulation layer formed on sidewall surfaces of the trench that is thicker than the capacitor dielectric layer to provide electrical isolation from adjacent semiconductor material.

17. The integrated circuit trench capacitor structure of claim 16, where the insulation layer is formed on sidewall surfaces of the trench and is at least twice as thick as the capacitor dielectric layer.

18. The integrated circuit trench capacitor structure of claim 16, where the recessed second capacitor plate is formed in a trench that separates a first active area in which is formed one or more first transistors from a second active area in which is formed one or more second transistors.

* * * * *